United States Patent

[11] 3,560,815

[72] Inventor Raymond A. Sigsbee
Schenectady, N.Y.

[21] Appl. No. 766,605
[22] Filed Oct. 10, 1968
[45] Patented Feb. 2, 1971
[73] Assignee General Electric Company
a corporation of New York

[54] VOLTAGE-VARIABLE CAPACITOR WITH EXTENDIBLE PN JUNCTION REGION
16 Claims, 4 Drawing Figs.

[52] U.S. Cl. ........ 317/235, 317/234, 307/299, 307/320
[51] Int. Cl. ........ H01l 5/02
[50] Field of Search ........ 317/234, 235, 237—241

[56] References Cited

UNITED STATES PATENTS

| | | | |
|---|---|---|---|
| 2,964,648 | 12/1960 | Doucette et al. | 317/234X |
| 2,989,650 | 6/1961 | Doucette et al. | 317/234X |
| 3,045,129 | 7/1962 | Atalla et al. | 317/235X |
| 3,206,670 | 9/1965 | Atalla | 317/235X |
| 3,303,059 | 2/1967 | Kerr et al. | 317/235X |
| 3,401,349 | 9/1968 | Mitchell | 317/235X |
| 3,454,894 | 7/1969 | Voorhoeve | 317/235X |

*Primary Examiner*—James D. Kallam
*Attorneys*—Richard R. Brainard, Marvin Snyder, Paul A. Frank, Frank L. Neuhauser, Oscar B. Waddell and Melvin M. Goldenberg

ABSTRACT: A PN junction region formed in a portion of a semiconductor wafer extends beneath the edge of a conductor overlaid on an insulating layer atop the wafer, in absence of voltage above a threshold amplitude across the conductor and wafer. As this voltage is increased to exceed the threshold amplitude, majority carriers are repelled from the wafer surface beneath the conductor and sufficient minority carriers are accumulated near the surface to invert the surface. This extends the PN junction beneath the entire conductor, with an attendant increase in junction capacitance.

PATENTED FEB 2 1971 3,560,815

SHEET 1 OF 2

INVENTOR:
RAYMOND A. SIGSBEE,
by Marvin Snyder
HIS ATTORNEY

INVENTOR:
RAYMOND A. SIGSBEE,
by Marvin Snyder
HIS ATTORNEY

VOLTAGE-VARIABLE CAPACITOR WITH EXTENDIBLE PN JUNCTION REGION

INTRODUCTION

This invention is related to the following copending, concurrently filed application: W. E. Engeler, Ser. No. 766,491.

This invention relates to variable capacity diodes, and more particularly to a diode wherein capacitance may be increased by establishing a surface inversion region to extend the area of an initial PN junction.

Many electrical circuits, such as tunable inductance-capacitance resonant circuits, require a variable circuit element. It is often advantageous to select a voltage-variable capacitor as the variable element. Examples of solid-state devices which exhibit a variable capacitance and hence may be useful in such applications include the conventional PN junction diode variable capacitor and the conventional metal oxide semiconductor (MOS) variable capacitor. Both of these conventional variable capacitor devices employ an essentially constant area of electrically active material (or area in which an applied electric field has an appreciable effect upon charge carriers), with capacitance in the PN junction diode capacitor being varied by electrically varying the thickness of the depletion region and capacitance in the MOS capacitor being varied by electrically varying the thickness of the depletion region at the semiconductor-oxide interface. A large range of capacitance ratio, or ratio of maximum capacitance to minimum capacitance, thus requires a thin initial depletion layer in the PN junction device of a thin oxide layer in the MOS device. The capacitance ratio in these conventional devices, however, is restricted by the constant area of electrically active material. The invention of the aforementioned Engeler application, which comprises an improved MOS variable capacitor structure, is similarly a capacitor of substantially constant area electrically active material.

In the voltage-variable capacitor of the instant invention, a larger ratio of maximum capacitance to minimum capacitance than possible with the aforementioned variable capacitors is achieved by employing a semiconductor diode of variable PN junction area. The variable PN junction area is a consequence of the capability to establish a surface inversion layer (or shallow region extending from the surface into the semiconductor wafer in which majority carriers are depleted and minority carriers are accumulated close to the surface) which lengthens the initial PN junction in the semiconductor. This permits a much larger variation in capacitance ratio than obtainable in conventional semiconductor variable capacitors. Moreover, the lengthened PN junction may be achieved substantially instantaneously, thus providing a dual capacitance value.

Accordingly, one object of the invention is to provide a voltage-variable capacitor having a wide range of capacitance variation with applied voltage.

Another object is to provide a semiconductor junction diode in which an initial PN junction area may be extended by establishing a surface inversion layer in the semiconductor.

Another object is to provide a variable capacitor which combines the capacitance of a PN junction variable capacitor with the capacitance due to extending the PN junction area by creating an inversion layer in the device.

Another object is to provide a capacitor which is capable of being switched electrically from one value of capacitance to another.

Briefly, in accordance with a preferred embodiment of the invention, a voltage-variable capacitor is described. The capacitor comprises a semiconductor wafer of one type conductivity with a region of opposite type conductivity diffused into a first portion of the wafer and extending to a predetermined depth beneath one surface thereof. Conductive means are insulatedly disposed above the one surface of the wafer over a second portion of the wafer, with an edge overlapping the first portion of the wafer. Means are provided for applying a variable electrical control potential across the conductive means and the wafer so as to permit establishment of a surface inversion layer in the wafer beneath the conductive means. Output means are connected across the region of opposite type conductivity and the remainder of the wafer in order to exhibit a variable output capacitance.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
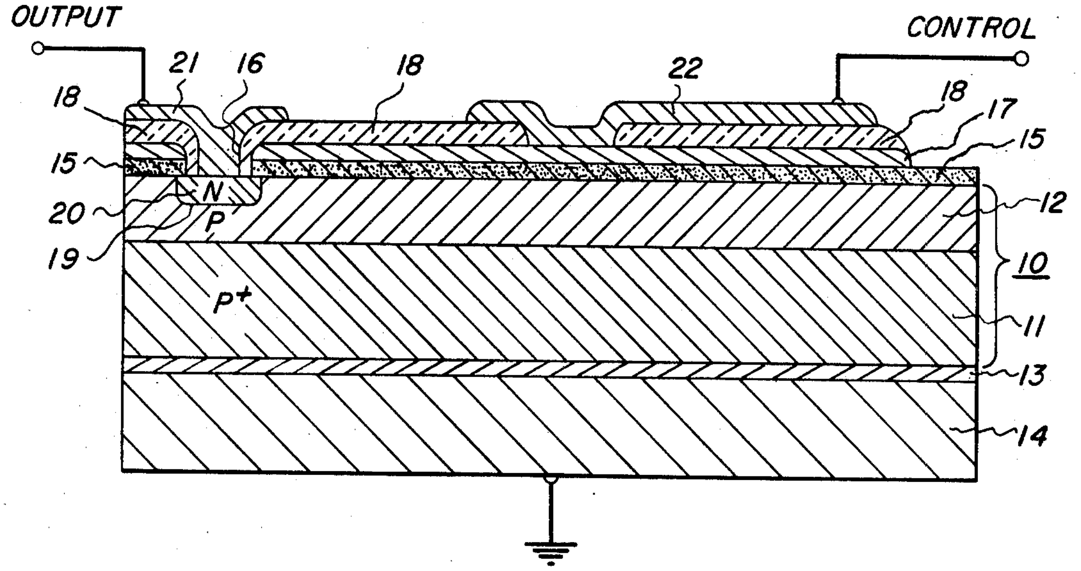
FIG. 1 is a cross-sectional view of one embodiment of the instant invention wherein control voltage applied thereto is either zero or below a predetermined threshold amplitude.

In FIG. 1, a wafer 10 of semiconductor material such as silicon is shown comprising a heavily doped substrate 11 of one type conductivity and a less heavily doped region 12 of the one type conductivity. Wafer 10 may comprise a discrete device or, in the alternative, a portion of an integrated circuit. For illustrative purposes, it will be assumed that the one type conductivity is P-type, so that more heavily doped region 11 is designated P and less heavily doped region 12 is designated P. Typically, region 12 is epitaxially grown on region 11 and is doped to a level which results in a resistivity in the order of 10 ohm-centimeters. Examples of processes by which region 12 may be grown epitaxially are described and claimed in W. C. Dash et al. U.S. Pat. No. 3,316,130, issued Apr. 25, 1967, and assigned to the instant assignee. As described in the aforementioned Dash et al. patent, for example, this epitaxial deposition is performed by providing a source of silicon juxtaposed in closely spaced relation with substrate 11, heating the source and the substrate, with the substrate being heated to a higher temperature than the source, and introducing an atmosphere of iodine vapor into the system so as to cause silicon from the source to be epitaxially grown on the semiconductor material of substrate 11. In this process, the source contains P-type impurities in a concentration to ensure that epitaxially grown region 12 exhibits a resistivity in the order of about 10 ohm-centimeters. Typical acceptor impurities which may be employed include boron, aluminum, gallium and indium.

A thin layer of insulation 15, conveniently silicon dioxide, is next formed atop silicon layer 12 as by thermal growth in an oxidizing atmosphere to a thickness typically in the range of 1,000 to 1,200 angstroms. A layer 17 of metal, such as molybdenum, is then evaporated atop a portion of insulating layer 15, and an opening 16 is etched therein by conventional photolithographic techniques employing photoresist compounds. If desired, opening 16 may be further etched through insulating layer 15 to the surface of wafer 10 so that metallic layer 17, which is thus insulatedly disposed atop a portion of the surface of wafer 10, is patterned to be substantially coextensive with insulation layer 15 at opening 16. A layer 18 of doped glass is next deposited over the surface of the device. Layer 18 contains a dopant of conductivity determining type opposite to the dopants in semiconductor wafer 10. In this instance, therefore, layer 18 contains a donor impurity, such as phosphorus, and is applied by pyrolytically depositing ethyl orthosilicate and triethyl phosphate, using argon carrier gas, as described in D. M. Brown et al. application Ser. No. 675,228 filed Oct. 13, 1967 and assigned to the instant assignee.

At this juncture, the device is heated to a temperature of about 1,150°C for about 1 ½ hours in order to diffuse the donor impurity through opening 16 into semiconductor layer 12 and form a PN junction 19 defined by the interface between layer 12 and the resulting diffused N-type region 20. The resulting thickness of N-type region 20 is typically about 2 microns, while the doping level thereof is in the order of $10^{19}$ donor atoms per cubic centimeter. It should be noted that a portion of region 20 extends beneath an edge of molybdenum layer 17.

Glass layer 18 is next etched in buffered hydrofluoric acid which preferably comprises 10 parts 40 percent ammonium fluoride solution in 1 part 48 percent hydrofluoric acid solution so as to expose a portion of the surface of diffused region 20 and a portion of the surface of molybdenum layer 17. Layers of aluminum 21 and 22 are then evaporated over the surface of the device in order to contact the surface of diffused region 20 and the surface of molybdenum layer 17, respectively.

Substrate 11 is then mounted on a conductive heat sink 14, such as of molybdenum, through a gold layer 13. In order to fasten substrate 11 to heat sink 14, the device is heated to the gold-silicon eutectic temperature. This temperature is sufficiently high to produce brazing which causes the gold of layer 13 to bond to molybdenum heat sink 14. Leads for making electrical contact to the device may then be attached to aluminum layers 21 and 22 and molybdenum heat sink 14 as by thermocompression or ultrasonic bonding.

In operation, voltage applied to contact 22 with respect to grounded heat sink 14 is preferably of positive polarity, with the various regions of semiconductor 10 being of the conductivity types assumed, supra. This voltage tends to repel majority charge carriers, here holes, away from the silicon-silicon dioxide interface directly beneath conductor 17, establishing a depletion region in semiconductor 12 adjacent this interface; that is, in this region the net concentration of charge carriers is decreased considerably below the concentration of uncompensated acceptor ions.

Figure 2:
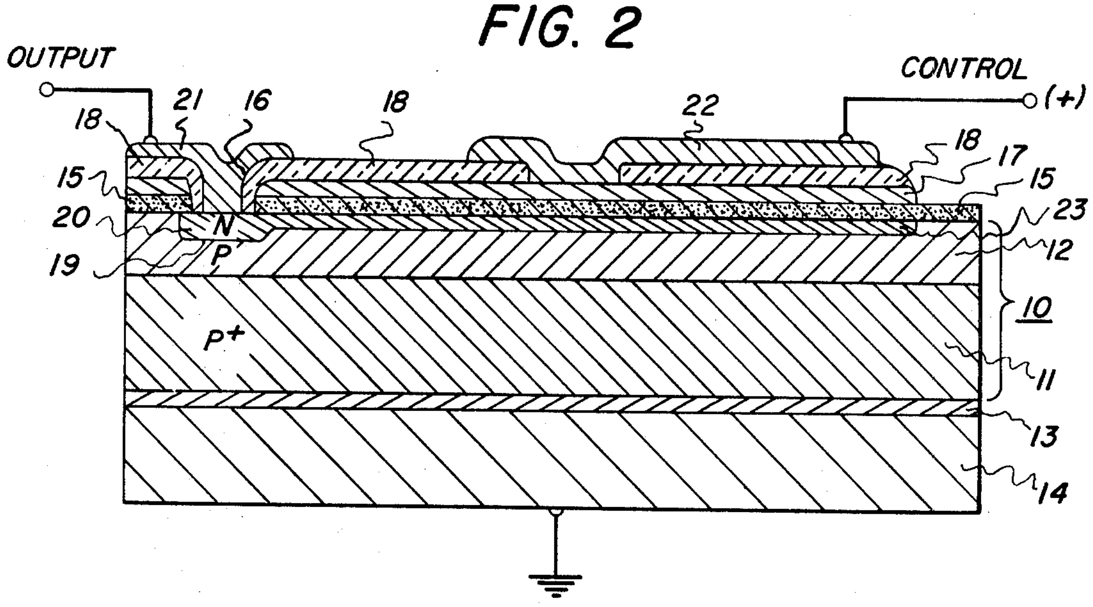
FIG. 2 is a cross-sectional view of the embodiment of the instant invention shown in FIG. 1 when a control potential above a predetermined threshold amplitude is applied thereto.

As positive voltage applied to contact 22 is increased in amplitude, thickness of the depletion region beneath conductor 17 increases. This increase in thickness has substantially no effect upon diode capacitance since it has substantially no effect upon the depletion region associated with PN junction 19. However, as this positive voltage is increased still further in amplitude, minority charge carriers, here electrons, are attracted to the surface of semiconductor layer 12 at the interface with silicon dioxide layer 15. Minority charge carriers are thus accumulated with increasing voltage amplitude. When the voltage amplitude is increased beyond a threshold level, the minority charge carriers outnumber the uncompensated acceptor ions. In the portion of semiconductor material in which this occurs, the conductivity type of the material is inverted; accordingly, portion 23 of semiconductor layer 12 near the interface with silicon dioxide layer 15 becomes N-type, as illustrated in FIG. 2 and, due to the edge of layer 17 overlapping a portion of N-type region 20, merges with N-type region 20. In this manner, N-type region 20 is made to extend effectively throughout the entire area of semiconductor layer 12 situated beneath conductor 17, greatly enlarging the extent of PN junction 19 formed by region 20 and layer 12. The enlarged area of PN junction 19 results in an enlarged capacitance for the device. Conversely, as amplitude of voltage on contact 22 decreases, fewer minority charge carriers are attracted to the surface of semiconductor layer 12 at the interface with silicon dioxide layer 15, until region 23 reverts to P-type conductivity. At this point, the capacitance exhibited by the device is once again that of original PN junction 19, shown in FIG. 1.

It should be noted that positive voltage amplitude applied to contact 22 may be increased substantially instantaneously to a value of sufficient amplitude to enlarge the area of PN junction 19, as by application of a step voltage thereto. Similarly, this positive voltage amplitude may be decreased substantially instantaneously to its original amplitude, returning the area of the PN junction to its original size. In this respect, the device is capable of functioning as a dual value capacitor.

Figure 3:
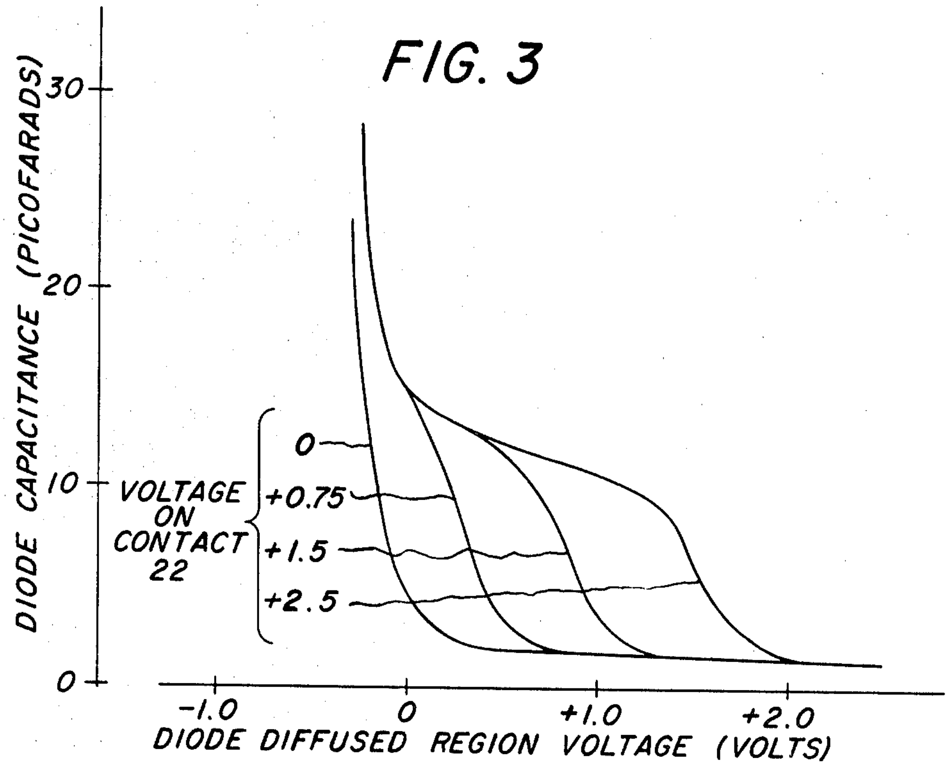
FIG. 3 is a graphical illustration of operation of the device illustrated in FIGS. 1 and 2 under various electrical conditions.

In FIG. 3, electrical characteristics of a typical embodiment of the device shown in FIGS. 1 and 2 are graphically illustrated. It can be seen that at any given positive voltage on the diode diffused region, the diode is reverse biased. Thus, at a diffused region voltage of +0.25 volts for example, an increase in voltage applied to contact 22 of the device, extending over the entire range of values illustrated in FIG. 3, produces a marked increase in diode capacitance. If voltage on contact 22 of the diode is to be controllably varied, the diode is preferably operated at a reverse bias on the junction in order to avoid the high conductivity and consequential power losses which occur during operation in the forward biased condition. On the other hand, if a constant voltage is maintained on contact 22, the diode capacitance varies with voltage across the PN junction thereof according to the diode capacitance-diffused region voltage characteristic for the particular voltage on contact 22. A maximum rate of change in diode capacitance thus occurs when the diffused region positive voltage is of a value to situate the diode operating point on the steeply sloped portion of the characteristic for the selected voltage on contact 22.

It should be noted that the steeply sloped portion of each characteristic, for positive diffused region voltage, represents the creation or elimination of inversion layer 23. The gradually sloped regions at either end of each of these steeply sloped portions represent conditions wherein the inversion layer is either substantially fully eliminated; that is, the upper gradually sloped region is reached when the inversion layer is substantially fully created and the lower gradually sloped region is reached when the inversion layer is substantially fully eliminated. Thus it is evident that the invention provides an output which permits combining the capacitance of a PN junction variable capacitor (such as illustrated by the curve for zero voltage on contact 22) with the capacitance due to extending the area of the PN junction by creating an inversion layer in the device, resulting in the curves shown for voltages on contact 22 of +.75, +1.5 and +2.5 volts.

Figure 4:
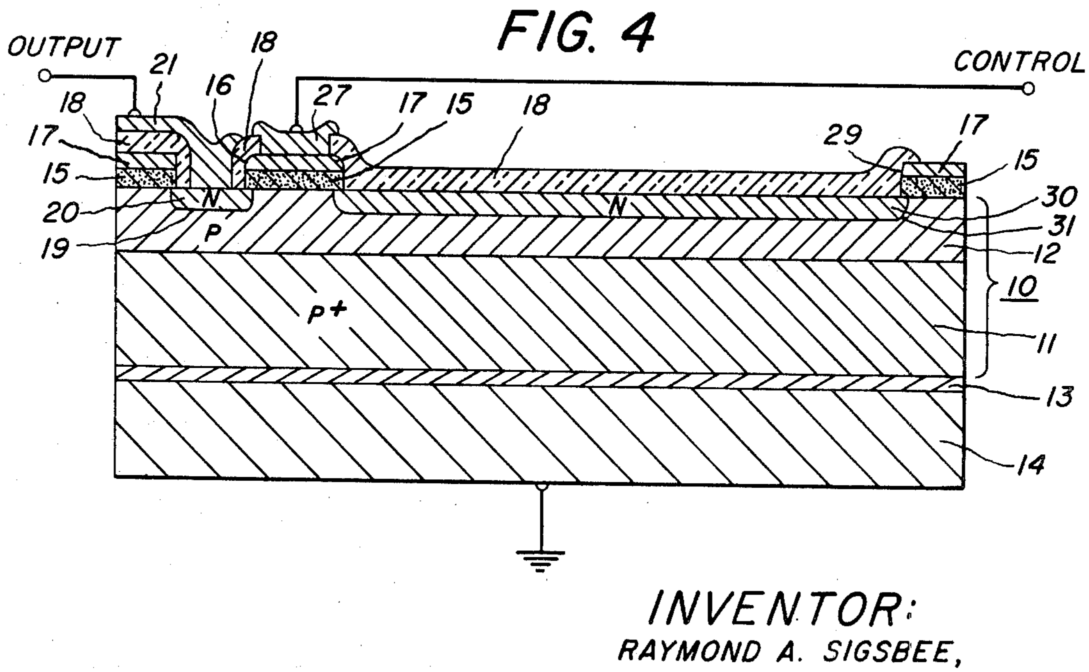
FIG. 4 is a cross-sectional view of another embodiment of the instant invention.

FIG. 4 illustrates a second embodiment of the invention wherein the inverted region joins the original PN junction with a relatively larger PN junction. The device includes N-type region 20 diffused in P-type layer 12 to form PN junction 19, as in the first embodiment, but also includes a second, relatively large N-type region 30 diffused in P-type layer 12 to form a PN junction 31. N-type region 30 is formed simultaneously with N-type region 20 by diffusion from doped glass layer 18. Region 20 is formed due to a second opening 29 etched in molybdenum layer 17 in addition to opening 16. Both openings 16 and 29 may be etched through silicon dioxide layer 15, if desired, so as to permit deposition of doped glass layer 18 atop the surface of wafer 10.

In operation, the portion of layer 12 at the surface thereof, situated directly beneath contact 27, is inverted when the amplitude of control voltage exceeds a predetermined threshold value. As a result, N-type region 30 becomes conductively joined to N-type region 20 through the inverted region, resulting in an overall PN junction which includes the extent of junctions 19 and 31 together with that formed between the inverted region and P-type layer 12. By employing N-type region 30 in this embodiment, the resistivity of the overall N-type region during inversion is below that of the previous embodiment, resulting in a reduction in the resistive component of current through the capacitor output circuit.

The foregoing describes a voltage-variable capacitor having a wide range of capacitance variation with applied voltage. The capacitor comprises a semiconductor junction diode in which the initial PN junction area may be extended by creating an inversion layer in the semiconductor material, enabling the capacitance of the PN junction to be combined with the capacitance due to the extension of area of the PN junction. Moreover, the capacitor is capable of being switched substantially instantaneously from one value of capacitance to another.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

I claim:

1. A voltage-variable capacitor comprising:

a semiconductor wafer of one type conductivity, said wafer containing in a first portion thereof a region of opposite type conductivity extending from one surface thereof into said wafer;

conductive means insulatingly disposed above said one surface of said wafer over a second portion of said wafer, said conductive means having at least an edge thereof overlapping said first portion of the wafer;

means coupling a variable electrical control potential across said conductive means and said wafer for establishing a surface inversion layer in the wafer connected with said region of opposite conductivity and beneath the conductive means when the amplitude of said potential rises above a predetermined value; and circuit means connected between said region of opposite type conductivity and the remainder of said wafer for supplying an output capacitance that varies with said electrical control potential.

2. The voltage-variable capacitor of claim 1 including electrical insulator means situated between said conductive means and said one surface of said wafer.

3. The voltage-variable capacitor of claim 1 wherein said semiconductor wafer comprises silicon and said electrical insulator means comprises silicon dioxide.

4. A voltage-variable capacitor comprising:

a semiconductor wafer having a portion of one type conductivity and a region of opposite type conductivity defining a PN junction of predetermined area therein;

means for controllably establishing an inversion layer in said one type conductivity portion of said wafer with the layer extending to said region of opposite type conductivity and merging therewith; and means coupled to the sides of said wafer, including means on either side of said PN junction for supplying electrical capacitance from said PN junction together with the inversion layer.

5. The voltage-variable capacitor of claim 4 wherein said means for controllably establishing an inversion layer includes means affixed to said semiconductor wafer for establishing an electric field thereon.

6. The voltage-variable capacitor of claim 5 wherein said means affixed to said semiconductor wafer comprises insulator means disposed atop the surface of said wafer and conductive means disposed atop the surface of said insulator means, said conductive means overlapping above the surface of said region of opposite type conductivity.

7. The voltage-variable capacitor of claim 6 wherein said semiconductor material comprises silicon, said insulator means comprises silicon dioxide, and said conductive means comprises a layer of metal.

8. The voltage-variable capacitor of claim 7 wherein said metal comprises molybdenum.

9. A voltage-variable capacitor comprising:

a semiconductor wafer of one type conductivity, said wafer containing in each of first and second separate portions thereof a region of opposite type conductivity extending from one surface thereof into said wafer;

conductive means insulatingly disposed above said one surface of said wafer over a third portion of said wafer, said conductive means having at least one edge thereof overlapping said first portion of said wafer and at least another edge thereof overlapping said second portion of said wafer;

means coupling a variable electrical control potential across said conductive means and said wafer for establishing a surface inversion layer in the wafer that connects the first and second regions of opposite conductivity beneath the conductive means when the amplitude of said potential rises above a predetermined value; and circuit means connected to said region of opposite type conductivity and the remainder of said wafer for providing an output capacitance which varies as said electrical control potential is varied.

10. The voltage-variable capacitor of claim 9 including electrical insulator means situated between said conductive means and said one surface of said wafer.

11. The voltage-variable capacitor of claim 10 wherein said semiconductor wafer comprises silicon and said electrical insulator means comprises silicon dioxide.

12. A voltage-variable capacitor comprising:

a semiconductor wafer of one type conductivity containing first and second separate PN junctions of predetermined area therein, said first and second PN junctions being defined respectively by first and second separate regions of opposite type conductivity formed in said semiconductor of said one type conductivity;

means for controllably establishing an inversion layer in said one type conductivity portion of said wafer with the layer extending to said first and second separate regions of opposite type conductivity and merging therewtih; and means coupled to said opposite conductivity region of said first PN junction and said wafer to permit electrical sensing of capacitance across said first PN junction.

13. The voltage-variable capacitor of claim 12 wherein said means for controllably establishing an inversion layer includes means affixed to said semiconductor wafer for establishing an electric field thereon.

14. The voltage-variable capacitor of claim 13 wherein said means affixed to said semiconductor wafer comprises insulator means disposed atop the surface of said wafer and conductive means disposed atop the surface of said insulator means, said conductive means overlapping above the surface of each of said first and second separate regions of opposite type conductivity.

15. The voltage-variable capacitor of claim 14 wherein said semiconductor material comprises silicon, said insulator means comprises silicon dioxide, and said conductive means comprises a layer of metal.

16. The voltage-variable capacitor of claim 15 wherein said metal comprises molybdenum.